United States Patent
Miller et al.

(10) Patent No.: US 10,910,506 B1
(45) Date of Patent: Feb. 2, 2021

(54) SOLAR CELL WITH GRADATION IN THE TOP WINDOW LAYER

(71) Applicant: SolAero Technologies Corp., Albuquerque, NM (US)

(72) Inventors: Nathaniel Miller, Albuquerque, NM (US); Pravin Patel, Albuquerque, NM (US); Bed Pantha, Albuquerque, NM (US); Benjamin Cho, Albuquerque, NM (US); Mark Stan, Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 0 days.

(21) Appl. No.: 15/464,651

(22) Filed: Mar. 10, 2017

Related U.S. Application Data (63) Continuation-in-part of application No. 14/682,905, filed on Apr. 9, 2015.

(51) Int. Cl.
| | |
|---|---|
| *H01L 31/0725* | (2012.01) |
| *H01L 31/0735* | (2012.01) |
| *H01L 31/0304* | (2006.01) |
| *H02S 40/22* | (2014.01) |
| *H01L 31/0216* | (2014.01) |
| *H01L 31/18* | (2006.01) |

(52) U.S. Cl.
CPC .... *H01L 31/0725* (2013.01); *H01L 31/02168* (2013.01); *H01L 31/03046* (2013.01); *H01L 31/0735* (2013.01); *H01L 31/1844* (2013.01); *H02S 40/22* (2014.12)

(58) Field of Classification Search
None
See application file for complete search history.

(56) References Cited

U.S. PATENT DOCUMENTS

| | | | | | |
|---|---|---|---|---|---|
| 4,094,704 | A | * | 6/1978 | Milnes | H01L 31/043 136/244 |
| 6,951,819 | B2 | * | 10/2005 | Iles | H01L 31/0687 438/705 |
| 2010/0229930 | A1 | * | 9/2010 | Fetzer | H01L 31/0687 136/255 |
| 2012/0240978 | A1 | * | 9/2012 | Celaya Prieto | H01L 31/052 136/246 |
| 2013/0228216 | A1 | * | 9/2013 | Cornfeld | H01L 31/06875 136/255 |

* cited by examiner

*Primary Examiner* — Tae-Sik Kang (57) ABSTRACT

A multijunction solar cell including a substrate and at least one solar subcell having an emitter layer, a base layer, and a window layer adjacent to the emitter layer composed of a semiconductor window material, wherein the window material has a graded composition such that the material at the interface between the top surface of the emitter layer of the at least one solar subcell and the bottom surface of the window layer has a compression as measured by a delta in the Bragg angle from the substrate in a range of 0 to 500 arcseconds in compression, and material at the top surface of the window layer has a tension as measured by a delta in the Bragg angle from the substrate in a range of 50 to 700 arcseconds in tension, wherein the delta in the Bragg angle is obtained from a rocking curve from a triple axis coupled scan of $\Omega$ and $2\theta$ (omega-2theta) using 1.5406 Å radiation.

20 Claims, 8 Drawing Sheets

SOLAR CELL WITH GRADATION IN THE TOP WINDOW LAYER

REFERENCE TO RELATED APPLICATIONS

This application is a continuation in part of U.S. patent application Ser. No. 14/682,905, filed Apr. 9, 2015, which is incorporated herein by reference in its entirety.

This application is related to co-pending U.S. patent application Ser. No. 13/964,774 filed Aug. 12, 2013.

This application is related to co-pending U.S. patent application Ser. No. 13/921,756 filed Jun. 19, 2013.

This application is also related to co-pending U.S. patent application Ser. No. 13/768,683 filed Feb. 15, 2013.

GOVERNMENT RIGHTS STATEMENT

This invention was made with government support under Contract No. FA8650-13-C-5501 awarded by the U.S. Air Force. The Government has certain rights in the invention.

BACKGROUND OF THE INVENTION

1. Field of the Invention

The present disclosure relates to solar cells and the fabrication of solar cells, and more particularly the design and specification of the window layer in multijunction solar cells based on III-V semiconductor compounds.

2. Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500x), commercially available III-V compound semiconductor multijunction solar cells in terrestrial applications (at AM1.5D) have energy efficiencies that exceed 37%. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided by the photovoltaic power system. Thus, as payloads become more sophisticated, weight or mass of the photovoltaic power system, and more particularly the power-to-weight ratio of the solar cells becomes increasingly more important, and there is increasing interest in lighter weight, "thin film" type solar cells having both high efficiency and low mass.

The efficiency of energy conversion, which converts solar energy (or photons) to electrical energy, depends on various factors such as the design of solar cell structures, the choice of semiconductor materials, and the thickness of each cell. In short, the energy conversion efficiency for each solar cell is dependent on the optimum utilization of the available sunlight across the solar spectrum by the subcells in a multijunction solar cell. As such, the characteristic of sunlight absorption in semiconductor material, also known as photovoltaic properties, is critical to determine the most efficient number and sequence of subcells, and the semiconductor material (with specific bandgap, thickness, and electrical properties) in each subcell, to achieve the optimum energy conversion.

Typical III-V compound semiconductor solar cells are fabricated on a semiconductor wafer in vertical, multijunction structures or stacked sequence of solar subcells, each subcell formed with appropriate semiconductor layers and including a p-n photoactive junction. Each subcell is designed to convert photons over different spectral or wavelength bands to electrical current. After the sunlight impinges on the front of the solar cell, and photons pass through the subcells, the photons in a wavelength band that are not absorbed and converted to electrical energy in the region of one subcell propagate to the next subcell, where such photons are intended to be captured and converted to electrical energy, assuming the downstream subcell is designed for the photon's particular wavelength or energy band.

The individual solar cells or wafers are then disposed in horizontal arrays, with the individual solar cells connected together in an electrical series and/or parallel circuit. The shape and structure of an array, as well as the number of cells it contains, are determined in part by the desired output voltage and current needed by the payload or subcomponents of the payload.

The energy conversion efficiency of multijunction solar cells is affected by such factors as the number of subcells, the thickness of each subcell, and the band structure, electron energy levels, conduction, and absorption of each subcell. Factors such as the short circuit current density ($J_{sc}$), the open circuit voltage ($V_{oc}$), and the fill factor are also important characterizing parameters in describing a subcell.

One of the important mechanical or structural considerations in the choice of semiconductor layers for a solar cell is the desirability of the adjacent layers of semiconductor materials in the solar cell, i.e. each layer of crystalline semiconductor material that is deposited and grown to form a solar subcell, have similar crystal lattice constants or parameters.

Many III-V devices, including solar cells, are fabricated by thin epitaxial growth of III-V compound semi conductors upon a relatively thick substrate. The substrate, typically of Ge, GaAs, InP, or other bulk material, acts as a template for the formation of the deposited epitaxial layers. The atomic spacing or lattice constant in the epitaxial layers will generally conform to that of the substrate, so the choice of epitaxial materials will be limited to those having a lattice constant similar to that of the substrate material.

The window layer is a semiconductor layer typically having a thickness of between 200 and 300 Angstroms that is disposed between the surface layer (which may be the antireflection coating or ARC layer, or the contact layer on which is deposited metallic grid lines over the top surface of the contact layer) and the emitter layer of a the top subcell, or between the tunnel diode and the emitter layer of a lower subcell. The window layer is introduced in the vertical stack of semiconductor layers to improve subcell efficiency by preventing minority carrier recombination at the top surface of the emitter layer, thereby permitting the minority carriers present in the emitter to migrate to the pn junction of the subcell, thereby contributing to the extracted electrical current. By being identified as a distinct layer, the window layer will have a composition that differs from both the adjacent layer and the emitter layer, but will generally be lattice matched to both semiconductor layers.

In some embodiments, the window layer may have a higher band gap than the adjacent emitter layer, with the higher band gap tending to suppress minority-carrier injection into the window layer, and as a result tending to reduce the recombination of electron-hole pairs that would otherwise occur in the window layer, thereby decreasing the efficiency of photon conversion at that subcell, and thus the overall efficiency of the solar cell.

Since the window layer is directly adjacent to the emitter layer, the interface with the emitter layer is appropriately designed so as to minimize the number of minority carriers entering the window. Another characteristic is the deep energy levels in the band gap, and here again one wishes to minimize such deep energy levels which would tend to create sites that could participate in Shockley-Read-Hall (SRH) recombination of electron-hole pairs. Since crystal defects can cause these deep energy levels, the composition and morphology of the window layer should be capable of forming an interface with the emitter layer that would minimize the crystal defects at the interface.

One design characteristic of the window layer which has as its goal the minimization of minority-carrier recombination at the window layer/emitter layer interface is sometimes referred to as emitter "passivation". Although "passivation" is a term in the field of semiconductor process technology that has various meanings depending on the specific materials and electrical properties and the context in which the term is used, such as the passivation approach described in the Applicant's U.S. patent application Ser. No. 13/921,756, which is hereby incorporated by reference. In this disclosure, "passivation" will be used to have the meaning of incorporation of a passivating material onto the surface of the window layer, as described herein, unless otherwise noted.

However, in addition to passivation techniques, in order to improve the efficiency of a solar cell even further, the present disclosure proposes additional design features for the window layer that have heretofore not been considered or analyzed.

SUMMARY OF THE INVENTION

3. Objects of the Disclosure

It is an object of the present disclosure to provide increased photoconversion efficiency in a multijunction solar cell.

It is another object of the present disclosure to provide increased photoelectric efficiency in a multijunction solar cell by lattice mismatching the emitter layer and the window layer of the top subcell.

It is another object of the present disclosure to provide improved photoelectric efficiency in a multijunction solar cell by utilizing an increasing gradation of Al in an InAlP window layer from the emitter/window layer contact surface to the top surface of the window layer.

It is another object of the present disclosure to provide a method of fabricating a multijunction solar cell by lattice mismatching the emitter layer and the directly adjacent window layer of the second or lower subcells.

It is an object of the present disclosure to provide increased photoconversion efficiency in a concentration assembly including a multijunction solar cell.

It is an object of the present disclosure to provide increased photoconversion efficiency in an assembly including an inverted metamorphic multijunction solar cell.

Some implementations of the present disclosure may incorporate or implement fewer of the aspects and features noted in the foregoing objects.

4. Features of the Disclosure

Briefly, and in general terms, the present disclosure provides a solar cell including a solar subcell having an emitter layer, a base layer, and a window layer adjacent to the emitter layer. The window layer is composed of a semiconductor material, with a graded composition (and an ensuing lattice constant change over the thickness of the layer) such that the window material located at the interface between the top surface of the emitter layer of the solar subcell and the bottom of the window is in compression with the emitter, and the material at the top surface of the window layer is in tension.

More particularly, the present disclosure is concerned with a window layer with a specific range of graded compositions which results in a corresponding change in the lattice constant of the material throughout the thickness of the window layer. Since neither the specific composition nor the lattice constant of the window layer are directly or easily measurable through the thickness of the layer which is less than 250 Angstroms, the method of using x-ray diffraction measurements on a separate thick or bulk layer is the easiest direct experimental approach. A beam of x-rays is directed and scanned over the target (the semiconductor wafer) and measurements of the interference patterns are made. Since we are interested in characterizing the window layer, one can examine the diffraction pattern from the window layer compared with the scan of the top surface of the emitter layer directly below it.

X ray diffraction is a well-known method to measure the crystalline characteristics of semiconductor materials, particularly materials with different compositions and lattice characteristics. U.S. Patent Application Publication 20150185167 is hereby incorporated by reference by way of background to demonstrate how Bragg reflection from a semiconductor material, such as a semiconductor wafer, may be used to measure crystalline characteristics.

Figure 1:
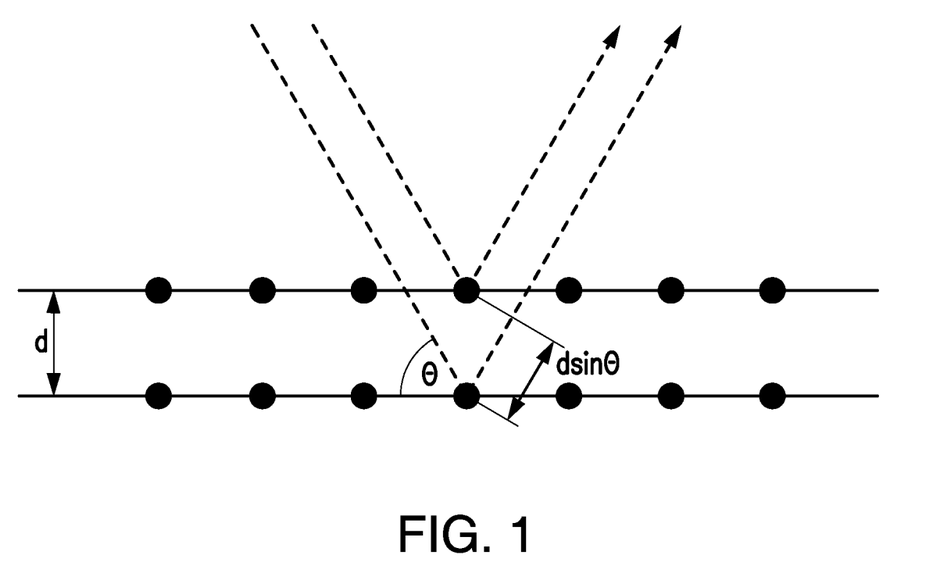
FIG. 1 is a schematic illustration showing Bragg diffraction conditions from radiation scattered by a crystalline solid.

Bragg diffraction occurs in a crystalline system when radiation with wavelength comparable to atomic spacings of the crystalline system is scattered in a specular fashion by atoms of the crystalline system, and constructive interference occurs. For a crystalline solid, the waves can be scattered from lattice planes separated by the interplanar distance d. When scattered waves remain in phase because the difference between the path lengths of the two waves is equal to an integer multiple of the wavelength, constructive interference is said to occur. The path difference between two waves undergoing interference can be represented by $2d \sin \theta$, where $\theta$ is the scattering angle as shown in FIG. 1. The effect of the constructive or destructive interference is intensified due to the cumulative effect of reflection in successive crystallographic planes of the crystalline lattice, which leads to Bragg's law. Bragg's law describes the condition on θ for the constructive interference to be at its strongest:

$$2d \sin \theta = n\lambda$$

where n is a positive integer and λ is the wavelength of incident wave. A diffraction pattern is obtained by measuring the intensity of scattered waves as a function of scattering angle. Very strong intensities known as Bragg peaks are obtained in the diffraction pattern at the points where the scattering angles satisfy the Bragg condition. Knowing the angle of the Bragg peak and the wavelength of the radiation allows the lattice constant of the material under examination to be determined. The differences in Bragg peaks for a multi-layer stack of semiconductor material allows the lattice constants of the different layers to be compared. A delta in angles (measured in arcseconds) allows the amount of lattice mismatch (resulting in either tension or compression of one layer) to be calculated.

The difference in the Bragg angle, or "delta", between the window layer and the emitter layer is directly experimentally measureable in the parameter of arcseconds between Bragg peaks. It is this difference in arcseconds that characterizes the difference in lattice constant of the two layers being compared.

A knowledge of the angle of the Bragg peak and the wavelength of the radiation allows the lattice constant of the material under examination to be determined. Differences in Bragg peaks for a multi-layer semiconductor allows the lattice constants of the different layers to be calculated. A delta or difference measured in arcseconds allows the amount of lattice mismatch between two layers, which then result in one layer being in tension or compression to be calculated. Thus, for simplicity in the description, in many places in the text below we will refer simply to a delta in Bragg angle in "arcseconds" rather than the more cumbersome "percentage change in lattice constant between a first layer and a second layer".

In the present disclosure, using an x-ray radiation source of 1.5406 Angstroms, the material at the interface between the top surface of the emitter layer of the solar subcell and the bottom surface of the window layer adjacent thereto has a compression as measured by a delta in the Bragg angle from the emitter in a range of 0 to 500 arcseconds in compression. The material at the top surface of the window layer has a tension as measured by a delta in the Bragg angle from the substrate in a range of 50 to 700 arcseconds in tension with respect to the emitter.

Figure 4:
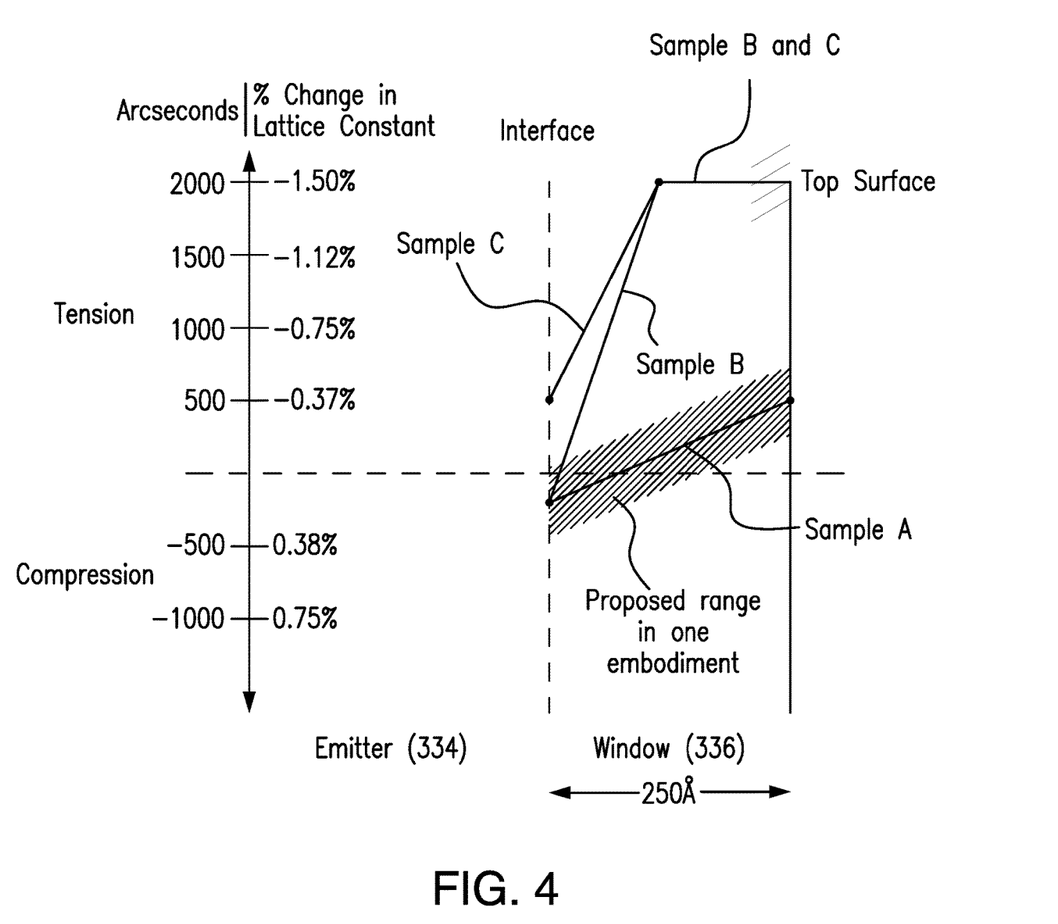
FIG. 4 is a graph of the lattice constant in the emitter and window layers of the top solar subcell of the multijunction solar cell of FIG. 3 according to the present disclosure.

As noted in FIG. 4, for the specific material system under consideration in the present disclosure, a delta of 500 arcseconds corresponds to a percentage change in lattice constant of −0.37% of the window layer compared to the emitter layer, while a delta of 2000 arcseconds corresponds to a percentage change in lattice constant of −1.50%, with the window layer being in tension. For the specific material system under consideration in the present disclosure, a delta of −500 arcseconds corresponds to a percentage change in lattice constant of +0.38% of the window layer compared to the emitter layer, while a delta of −1000 arcseconds corresponds to a percentage change in lattice constant of +0.75%, with the window layer being in compression.

Stated another way, the window material proposed in the present disclosure, located at the interface between the top surface of the emitter layer of the solar subcell and the bottom surface of the window layer adjacent thereto, has a compression characterized by a change in lattice constant in the range of −0.4% to +0.38% compared to the lattice constant of the emitter layer, while the material at the top surface of the window layer has a tension characterized by a change in lattice constant in the range of −0.25% to −1.50% compared to the lattice constant of the emitter layer, with the lattice constant of the window layer being graded between the bottom surface of the window layer and the top surface of the window layer.

Another way of describing the window material of the present disclosure for an embodiment in which the window layer is composed of InAlP or InGaP, is to define the amount of aluminum in mole fraction throughout the thickness of the window layer.

In some embodiments, the window layer is composed of InAlP or InGaP and the Al content at the bottom surface of the window layer is 48.9% or less.

In some embodiments, the window layer is composed of InAlP or InGaP and the Al content at the top surface of the window layer is 53.6% or more.

In some embodiments, the window layer is composed of InAlP or InGaP and the gradation in Al content in the layer at from the bottom surface to the top surface of the window layer is an increase of at least 5%.

In some embodiments, the window layer is composed of InAlP or InGaP and the Al content in the window layer increases from the bottom surface of the window layer to the top surface of the window layer.

In some embodiments, the window material has a graded composition such that the material at the interface between the top surface of the emitter layer of the at least one solar subcell and the bottom surface of the window layer has a compression as measured by a delta in the Bragg angle from the substrate in a range of 100 to 300 arcseconds in compression, and material at the top surface of the window layer has a tension as measured by a delta in the Bragg angle from the substrate in a range of 400 to 600 arcseconds in tension.

In some embodiments, the delta in the Bragg angle is obtained from a rocking curve from a triple axis coupled scan of Ω and 2θ (omega-2theta) using 1.5406 Å radiation directed to the specimen semiconductor wafer being tested.

In some embodiments, the window material has a graded composition such that the material at the interface between the top surface of the emitter layer of the at least one solar subcell and the bottom surface of the window layer has a compression as measured by a delta in the Bragg angle from the substrate of approximately 200 arcseconds in compression, and material at the top surface of the window layer has a tension as measured by a delta in the Bragg angle from the substrate of approximately 500 arcseconds in tension, wherein the delta in the Bragg angle is obtained from a rocking curve from a triple axis coupled scan of Ω and 2θ (omega-2theta) using 1.5406 Å radiation.

In some embodiments, the window material has a graded composition such that the material at the interface between the top surface of the emitter layer of the at least one solar subcell and the bottom surface of the window layer has a compression as measured by a delta in the Bragg angle from the substrate having a first value, and material at the top surface of the window layer has a tension as measured by a delta in the Bragg angle from the substrate having a second value, with the first and second values representing a graded composition of the window material selected to maximize the quantum efficiency of the subcell, wherein the delta in the Bragg angle is obtained from a rocking curve from a triple axis coupled scan of Ω and 2θ (omega-2theta) using 1.5406 Å radiation.

In some embodiments, the window material has a graded composition such that the material at the interface between the top surface of the emitter layer of the at least one solar subcell and the bottom surface of the window layer has a compression as measured by a delta in the Bragg angle from the substrate in the range of plus or minus 200 arcseconds from a point approximately 200 arcseconds in compression, and material at the top surface of the window layer has a tension as measured by a delta in the Bragg angle from the substrate in the range of plus or minus 200 arcseconds from a point approximately 500 arcseconds in tension, wherein the delta in the Bragg angle is obtained from a rocking curve from a triple axis coupled scan of Ω and 2θ (omega-2theta) using 1.5406 Å radiation.

In some embodiments, the window material has a graded composition such that the material at the interface between the top surface of the emitter layer of the at least one solar subcell and the bottom surface of the window layer has a compression as measured by a delta in the Bragg angle from the substrate in the range of plus or minus 200 arcseconds from a point approximately 200 arcseconds in compression, and material at the top surface of the window layer has a tension as measured by a delta in the Bragg angle from the substrate of approximately 500 arcseconds in tension, wherein the delta in the Bragg angle is obtained from a rocking curve from a triple axis coupled scan of Ω and 2θ (omega-2theta) using 1.5406 Å radiation.

In some embodiments, the composition of an element in the window layer is linearly graded so that the lattice constant in the window layer linearly increases from a point in compression at the bottom surface of the window layer to a point in tension at the top surface of the window layer.

In some embodiments, the composition of the window layer is linearly graded so that the concentration of Al in the window layer linearly increases from the bottom surface of the window layer to the top surface of the window layer.

In some embodiments, the composition of the window layer is graded so that the concentration of Al in the window layer increases from the bottom surface of the window layer to the top surface of the window layer.

In some embodiments, the composition of the window layer is graded so that the concentration of one element in the window material in the window layer increases from the bottom surface of the window layer to the top surface of the window layer so that the lattice constant changes from compression to tension as measured by a change in the deltas in the Bragg angles from the bottom surface of the window layer to the top surface of the window layer by at least 300 arcseconds, wherein the delta in the Bragg angle is obtained from a rocking curve from a triple axis coupled scan of Ω and 2θ (omega-2theta) using 1.5406 Å radiation.

In some embodiments, the composition of the window layer is graded so that the concentration of one element in the window material in the window layer increases from the bottom surface of the window layer to the top surface of the window layer so that the lattice constant changes from compression to tension as measured by a change in the deltas in the Bragg angles from the bottom surface of the window layer to the top surface of the window layer by at least 500 arcseconds, wherein the delta in the Bragg angle is obtained from a rocking curve from a triple axis coupled scan of Ω and 2θ (omega-2theta) using 1.5406 Å radiation.

In some embodiments, the composition of the window layer is graded so that the concentration of one element in the window material in the window layer increases from the bottom surface of the window layer to the top surface of the window layer so that the lattice constant changes from compression to tension as measured by a change in the deltas in the Bragg angles from the bottom surface of the window layer to the top surface of the window layer by at least 700 arcseconds, wherein the delta in the Bragg angle is obtained from a rocking curve from a triple axis coupled scan of Ω and 2θ (omega-2theta) using 1.5406 Å radiation.

In some embodiments, the solar cell is a multijunction solar cell, and the subcell with the composition of the window layer being graded includes at least the top subcell.

In some embodiments, the solar cell is a multijunction solar cell, and the subcell with the composition of the window layer being graded includes at least the subcell below the top subcell.

In another aspect, the present disclosure provides a method of forming a solar cell including at least one solar subcell having an emitter layer, a base layer, and a window layer adjacent to the emitter layer, wherein the composition of the window layer is graded so that the lattice constant of the window layer changes so that the layer is in tension from the interface to the adjacent emitter layer, to the window layer being in compression at the top of the window layer.

In another aspect, the present disclosure provides a method of forming a solar cell including at least one solar subcell having an emitter layer, a base layer, and a window layer adjacent to the emitter layer.

In another aspect, the present disclosure provides a method of fabricating a solar cell including forming a sequence of solar subcells with different band gaps on a substrate; at least one solar subcell of the sequence of solar subcells having an emitter layer, a base layer, and a window layer adjacent to the emitter layer wherein the window material has a graded composition such that the material at the interface between the top surface of the emitter layer of the at least one solar subcell and the bottom surface of the window layer has a compression as measured by a delta in the Bragg angle from the substrate in a range of 0 to 500 arcseconds in compression, and material at the top surface of the window layer has a tension as measured by a delta in the Bragg angle from the substrate in a range of 50 to 700 arcseconds in tension, wherein the delta in the Bragg angle is obtained from a rocking curve from a triple axis coupled scan of Ω and 2θ (omega-2theta) using 1.5406 Å radiation.

In another aspect, the present disclosure provides a method of fabricating a multijunction solar cell including a semiconductor contact layer; an upper first solar subcell disposed below the contact layer and being composed of a semiconductor material having a first band gap, and the first solar subcell having a base region and an emitter region; a window layer disposed directly over the emitter region of the upper first solar subcell and directly below the contact layer wherein the solar cell.

In some embodiments, the emitter of the upper first solar subcell is composed of InGaP, and the window layer is composed of InAlP.

In some embodiments, the emitter of the upper first solar subcell has a thickness of 80 nm, and the window layer has a thickness of less than 220 Angstroms.

In some embodiments, the base of the upper first solar subcell has a thickness of less than 700 nm.

In some embodiments, the base of the upper first solar subcell has a thickness of 670 nm.

In some embodiments, the upper subcell is composed of an InGaP emitter layer and an InGaP base layer, the second subcell is composed of GaInP emitter layer and a GaAs base layer, and further comprising at least a third subcell composed of a Ge emitter layer and a Ge base layer.

In some embodiments, the third subcell has a band gap of 0.67 eV, the second subcell has a band gap in the range of approximately 1.35 to 1.50 eV and the upper subcell has a band gap in the range of 1.87 to 2.2 eV.

In another aspect, the present disclosure provides a method of manufacturing a solar cell comprising: forming an upper first solar subcell having a first band gap under the top surface of the window layer; forming a second solar subcell adjacent to said first solar subcell and having a second band gap smaller than said first band gap; forming a third solar subcell adjacent to said second solar subcell and having a third band gap smaller than said second band gap; and forming a window layer over at least one of the subcells, the window layer having a composition that is graded so that the lattice constant of the window layer changes over its thickness so that the layer is in tension at the interface to the adjacent emitter layer, to the window layer being in compression at the top of the window layer.

In another aspect, the present disclosure provides a method of manufacturing a solar cell by forming at least one solar subcell having an emitter layer, a base layer, and a window layer adjacent to the emitter layer, wherein the window layer is lattice mismatched with respect to the emitter layer, and continues into an increasingly stressed state to the top surface of the window layer.

In some embodiments, the emitter of the upper first solar subcell has a thickness of 80 nm.

In some embodiments, the base of the upper first solar subcell has a thickness of less than 400 nm.

In some embodiments, the base of the upper first solar subcell has a thickness of 260 nm.

In some embodiments, additional layer(s) may be added or deleted in the cell structure without departing from the scope of the present disclosure.

Some implementations of the present disclosure may incorporate or implement fewer of the aspects and features noted in the foregoing summaries.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

BRIEF DESCRIPTION OF THE DRAWINGS

The invention will be better and more fully appreciated by reference to the following detailed description when considered in conjunction with the accompanying drawings, wherein.

DESCRIPTION OF THE PREFERRED EMBODIMENT

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

A variety of different features of multijunction solar cells and inverted metamorphic multijunction solar cells are disclosed in the related applications noted above. Some, many or all of such features may be included in the structures and processes associated with the solar cells of the present disclosure. However, more particularly, the present disclosure is directed in one embodiment to the composition of the window layer in the top subcell, and the lattice constant of the window layer over its thickness.

More generally, however, the present disclosure may be adapted to inverted metamorphic multijunction solar cells as disclosed in the parent application and its related applications that may include three, four, five, or six subcells, with band gaps in the range of 1.8 to 2.2 eV (or higher) for the top subcell, and 1.3 to 1.8 eV, 0.9 to 1.2 eV for the middle subcells, and 0.6 to 0.8 eV, for the bottom subcell, respectively.

The present disclosure provides a process for the design and fabrication of a window layer in a multijunction solar cell that improves light capture in the associated subcell and thereby the overall efficiency of the solar cell. More specifically, the present disclosure intends to provide a relatively simple and reproducible technique that is suitable for use in a high volume production environment in which various semiconductor layers are deposited in an MOCVD reactor, and subsequent processing steps are defined and selected to minimize any physical damage to the quality of the deposited layers, thereby ensuring a relatively high yield of operable solar cells meeting specifications at the conclusion of the fabrication processes.

Prior to discussing the specific embodiments of the present disclosure, a brief discussion of some of the issues associated with the design of multijunction solar cells, and in particular inverted metamorphic solar cells, and the context of the composition or deposition of various specific layers in embodiments of the product as specified and defined by Applicant is in order.

There are a multitude of properties that should be considered in specifying and selecting the composition of, inter alia, a specific semiconductor layer, the back metal layer, the adhesive or bonding material, or the composition of the supporting material for mounting a solar cell thereon. For example, some of the properties that should be considered when selecting a particular layer or material are electrical properties (e.g. conductivity), optical properties (e.g., band gap, absorbance and reflectance), structural properties (e.g., thickness, strength, flexibility, Young's modulus, etc.), chemical properties (e.g., growth rates, the "sticking coefficient" or ability of one layer to adhere to another, stability of dopants and constituent materials with respect to adjacent layers and subsequent processes, etc.), thermal properties (e.g., thermal stability under temperature changes, coefficient of thermal expansion), and manufacturability (e.g., availability of materials, process complexity, process variability and tolerances, reproducibility of results over high volume, reliability and quality control issues).

In view of the trade-offs among these properties, it is not always evident that the selection of a material based on one of its characteristic properties is always or typically "the best" or "optimum" from a commercial standpoint or for Applicant's purposes. For example, theoretical studies may suggest the use of a quaternary material with a certain band gap for a particular subcell would be the optimum choice for that subcell layer based on fundamental semiconductor physics. As an example, the teachings of academic papers and related proposals for the design of very high efficiency (over 40%) solar cells may therefore suggest that a solar cell designer specify the use of a quaternary material (e.g., InGaAsP) for the active layer of a subcell. A few such devices may actually be fabricated by other researchers, efficiency measurements made, and the results published as an example of the ability of such researchers to advance the progress of science by increasing the demonstrated efficiency of a compound semiconductor multijunction solar cell. Although such experiments and publications are of "academic" interest, from the practical perspective of the Applicants in designing a compound semiconductor multijunction solar cell to be produced in high volume at reasonable cost and subject to manufacturing tolerances and variability inherent in the production processes, such an "optimum" design from an academic perspective is not necessarily the most desirable design in practice, and the teachings of such studies more likely than not point in the wrong direction and lead away from the proper design direction. Stated another way, such references may actually "teach away" from Applicant's research efforts and the ultimate solar cell design proposed by the Applicants.

In view of the foregoing, it is further evident that the identification of one particular constituent element (e.g. indium, or aluminum) in a particular subcell, or the thickness, band gap, doping, or other characteristic of the incorporation of that material in a particular subcell, is not a "result effective variable" that one skilled in the art can simply specify and incrementally adjust to a particular level and thereby increase the efficiency of a solar cell. The efficiency of a solar cell is not a simple linear algebraic equation as a function of the amount of gallium or aluminum or other element in a particular layer. The growth of each of the epitaxial layers of a solar cell in an MOCVD reactor is a non-equilibrium thermodynamic process with dynamically changing spatial and temporal boundary conditions that is not readily or predictably modeled. The formulation and solution of the relevant simultaneous partial differential equations covering such processes are not within the ambit of those of ordinary skill in the art in the field of solar cell design.

Even when it is known that particular variables have an impact on electrical, optical, chemical, thermal or other characteristics, the nature of the impact often cannot be predicted with much accuracy, particularly when the variables interact in complex ways, leading to unexpected results and unintended consequences. Thus, significant trial and error, which may include the fabrication and evaluative testing of many prototype devices, often over a period of time of months if not years, is required to determine whether a proposed structure with layers of particular compositions, actually will operate as intended, let alone whether it can be fabricated in a reproducible high volume manner within the manufacturing tolerances and variability inherent in the production process, and necessary for the design of a commercially viable device.

Furthermore, as in the case here, where multiple variables interact in unpredictable ways, the proper choice of the combination of variables can produce new and unexpected results, and constitute an "inventive step".

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 2:
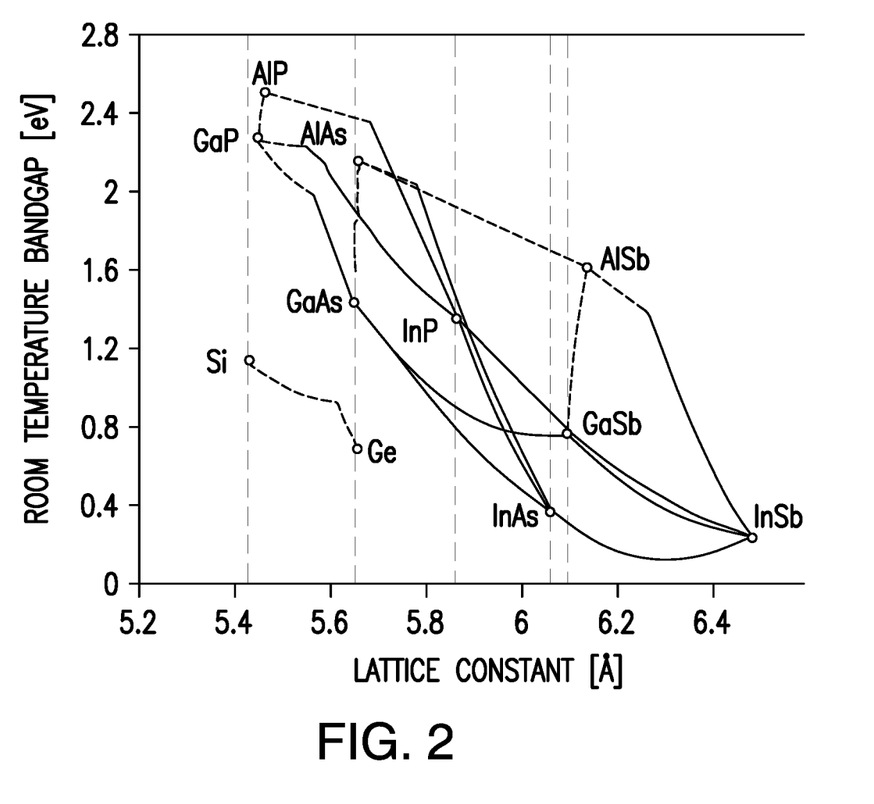
FIG. 2 is a graph representing the band gap of certain binary materials and their lattice constants.

FIG. 2 is a graph representing the band gap of certain binary materials and their lattice constants. The band gap and lattice constants of ternary materials are located on the lines drawn between typical associated binary materials (such as the ternary material AlGaAs being located between the GaAs and AlAs points on the graph, with the band gap of the ternary material lying between 1.42 eV for GaAs and 2.16 eV for AlAs depending upon the relative amount of the individual constituents). Thus, depending upon the desired band gap, the material constituents of ternary materials can be appropriately selected for growth.

The lattice constants and electrical properties of the layers in the semiconductor structure are preferably controlled by specification of appropriate reactor growth temperatures and times, and by use of appropriate chemical composition and dopants. The use of a vapor deposition method, such as Organo Metallic Vapor Phase Epitaxy (OMVPE), Metal Organic Chemical Vapor Deposition (MOCVD), or other vapor deposition methods for the growth may enable the layers in the monolithic semiconductor structure forming the cell to be grown with the required thickness, elemental composition, dopant concentration and grading and conductivity type.

The present disclosure is directed to a growth process using a metal organic chemical vapor deposition (MOCVD) process in a standard, commercially available reactor suitable for high volume production. More particularly, the present disclosure is directed to the materials and fabrication steps that are particularly suitable for producing commercially viable multijunction solar cells or inverted metamorphic multijunction solar cells using commercially available equipment and established high-volume fabrication processes, as contrasted with merely academic expositions of laboratory or experimental results.

It should be noted that the layers of a certain target composition in a semiconductor structure grown in an MOCVD process are inherently physically different than the layers of an identical target composition grown by another process, e.g. Molecular Beam Epitaxy (MBE). The material quality (i.e., morphology, stoichiometry, number and location of lattice traps, impurities, and other lattice defects) of an epitaxial layer in a semiconductor structure is different depending upon the process used to grow the layer, as well as the process parameters associated with the growth. MOCVD is inherently a chemical reaction process, while MBE is a physical deposition process. The chemicals used in the MOCVD process are present in the MOCVD reactor and interact with the wafers in the reactor, and affect the composition, doping, and other physical, optical and electrical characteristics of the material. For example, the precursor gases used in an MOCVD reactor (e.g. hydrogen) are incorporated into the resulting processed wafer material, and have certain identifiable electro-optical consequences which are more advantageous in certain specific applications of the semiconductor structure, such as in photoelectric conversion in structures designed as solar cells. Such high order effects of processing technology do result in relatively minute but actually observable differences in the material quality grown or deposited according to one process technique compared to another. Thus, devices fabricated at least in part using an MOCVD reactor or using a MOCVD process have inherent different physical material characteristics, which may have an advantageous effect over the identical target material deposited using alternative processes.

Figure 3:
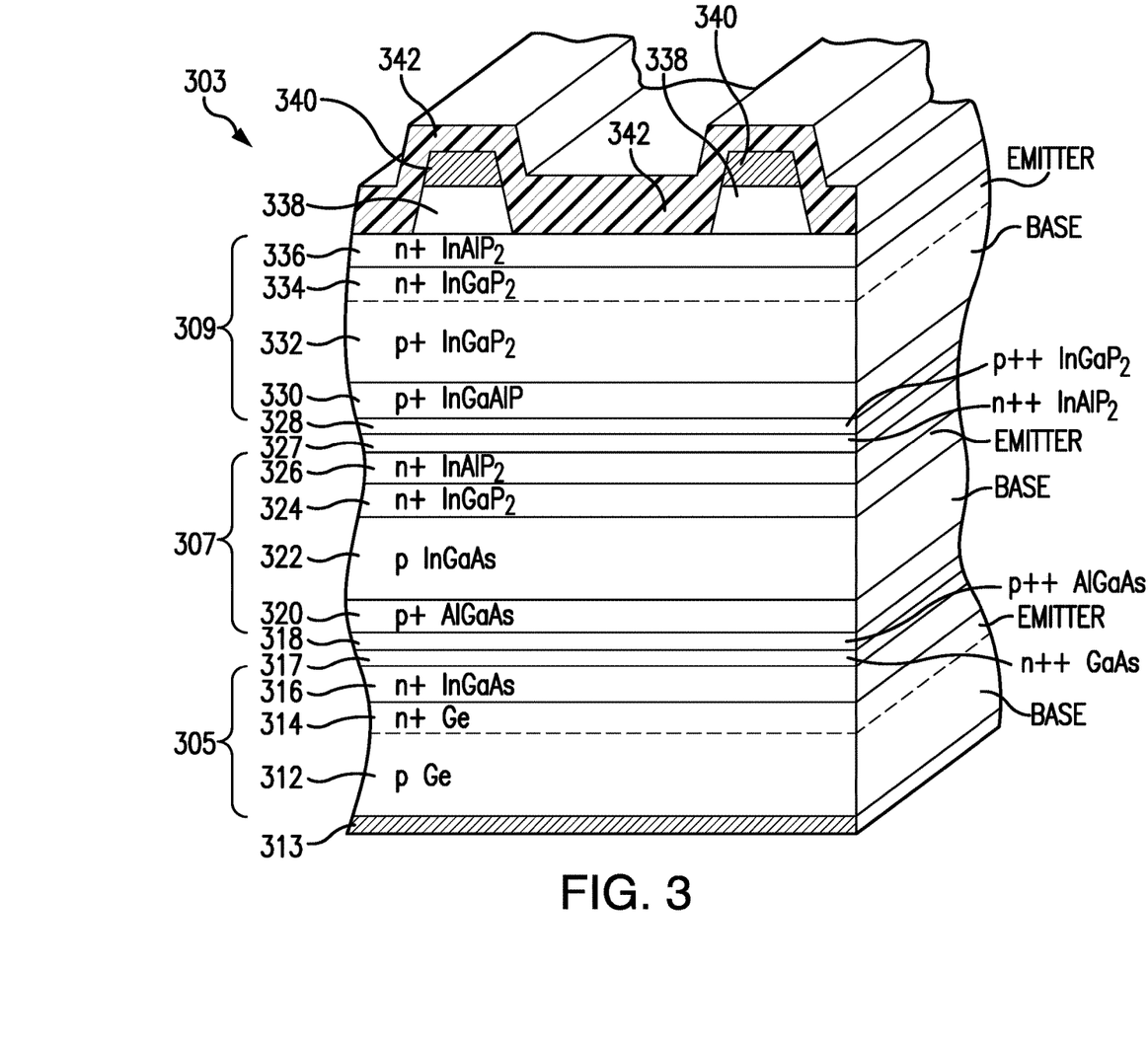
FIG. 3 is a cross-sectional view of the solar cell of a multijunction solar cell after several stages of fabrication including the deposition of certain semiconductor layers on the growth substrate up to the grid lines.

FIG. 3 illustrates a particular example of a multijunction solar cell device 303 which may be used to implement the window layer as provided by the present disclosure. In the Figure, each dashed line indicates the active region junction between a base layer and emitter layer of a subcell.

As shown in the illustrated example of FIG. 3, the bottom subcell 305 includes a substrate 312 formed of p-type germanium ("Ge") which also serves as a base layer. A contact pad 313 formed on the bottom of base layer 312 provides electrical contact to the multijunction solar cell 303. The bottom subcell 305 further includes, for example, a highly doped n-type Ge emitter layer 314, and an n-type indium gallium arsenide ("InGaAs") nucleation layer 316. The nucleation layer is deposited over the base layer 312, and the emitter layer is formed in the substrate by diffusion of deposits into the Ge substrate, thereby forming the n-type Ge layer 314. Heavily doped p-type aluminum gallium arsenide ("AlGaAs") and heavily doped n-type gallium arsenide ("GaAs") tunneling junction layers 318, 317 may be deposited over the nucleation layer 316 to provide a low resistance pathway between the bottom and middle subcells.

In the illustrated example of FIG. 3, the middle subcell 307 includes a highly doped p-type aluminum gallium arsenide ("AlGaAs") back surface field ("BSF") layer 320, a p-type InGaAs base layer 322, a highly doped n-type indium gallium phosphide ("InGaP2") emitter layer 324 and a highly doped n-type indium aluminum phosphide ("AlInP2") window layer 326. The InGaAs base layer 322 of the middle subcell 307 can include, for example, approximately 1.5% In. Other compositions may be used as well. The base layer 322 is formed over the BSF layer 320 after the BSF layer is deposited over the tunneling junction layers 318 of the bottom subcell 304.

The BSF layer 320 is provided to reduce the recombination loss in the middle subcell 307. The BSF layer 320 drives minority carriers from a highly doped region near the back surface to minimize the effect of recombination loss. Thus, the BSF layer 320 reduces recombination loss at the backside of the solar cell and thereby reduces recombination at the base layer/BSF layer interface. The window layer 326 is deposited on the emitter layer 324 of the middle subcell B.

The window layer 326 in the middle subcell B also helps reduce the recombination loss and improves passivation of the cell surface of the underlying junctions. Before depositing the layers of the top cell C, heavily doped n-type InGaP and p-type AlGaAs tunneling junction layers 327, 328 may be deposited over the middle subcell B.

In the illustrated example, the top subcell 309 includes a highly doped p-type indium gallium aluminum phosphide ("InGaAlP") BSF layer 330, a p-type InGaP2 base layer 332, a highly doped n-type InGaP2 emitter layer 334 and a highly doped n-type InAlP2 window layer 336. The base layer 332 of the top subcell 309 is deposited over the BSF layer 330 after the BSF layer 330 is formed over the tunneling junction layers 328 of the middle subcell 307. The window layer 336 is deposited over the emitter layer 334 of the top subcell after the emitter layer 334 is formed over the base layer 332. A cap or contact layer 338 may be deposited and patterned into separate contact regions over the window layer 336 of the top subcell 308. The cap or contact layer 338 serves as an electrical contact from the top subcell 309 to metal grid layer 340. The doped cap or contact layer 338 can be a semiconductor layer such as, for example, a GaAs or InGaAs layer.

After the cap or contact layer 338 is deposited, the grid lines 340 are formed. The grid lines 340 are deposited via evaporation and lithographically patterned and deposited over the cap or contact layer 338. The mask is subsequently lifted off to form the finished metal grid lines 340 as depicted in the Figure, and the portion of the cap layer that has not been metallized is removed, exposing the surface 342 of the window layer 336. In some embodiments, a trench or channel (not shown), or portion of the semiconductor structure, is also etched around each of the solar cells. These channels define a peripheral boundary between the solar cell (later to be scribed from the wafer) and the rest of the wafer, and leaves a mesa structure (or a plurality of mesas, in the case of more than one solar cell per wafer) which define and constitute the solar cells later to be scribed and diced from the wafer.

As more fully described in U.S. patent application Ser. No. 12/218,582 filed Jul. 16, 2008, hereby incorporated by reference, the grid lines 340 are preferably composed of Ti/Au/Ag/Au, although other suitable materials may be used as well.

FIG. 4 is a graph of the lattice constant in the emitter and window layers of the top solar subcell of the multijunction solar cell of FIG. 3 in one embodiment according to the present disclosure. The graph depicts the thickness of the emitter and window layers along the x-axis, and the stress or strain in each region of the window layer along the y-axis in units of both percent change in lattice constant, and the delta in arcseconds between Bragg peaks, as further discussed above. The materials formulation of the window layer in one embodiment is depicted by the heavy straight line extending from the interface between the top surface of the emitter layer of the subcell and the bottom surface of the window layer. The window material has a graded composition such that the material at the interface between the top surface of the emitter layer of the at least one solar subcell and the bottom surface of the window layer has a compression as measured by a delta in the Bragg angle from the emitter layer approximately 200 arcseconds in compression, and material at the top surface of the window layer has a tension as measured by a delta in the Bragg angle from the emitter layer of approximately 500 arcseconds in tension, wherein the delta in the Bragg angle is obtained from a rocking curve from a triple axis coupled scan of Ω and 2θ (omega-2theta) using a 1.5406 Å x-ray radiation source.

X-ray diffraction is a widely used technology to determine the lattice constant of an epilayer. The lattice constant is a function of the composition of the material. For example, for an AlInP composition, increasing the amount of aluminum in the material results in decreasing the lattice constant of the AlInP composition. Conversely, decreasing the amount of aluminum in an AlInP composition results in increasing the lattice constant of the AlInP composition.

The relationship between the composition of the window layer, the arcseconds measurement, and the mismatch or percentage (%) change in the lattice constant is set forth in the following table:

| Table of interest | | | | | | | |
|---|---|---|---|---|---|---|---|
| Strain | Arcsec | In % | Al % | Strain PPM | Angle delta (delta) | Bragg Angle | Lattice constant A | Mismatch % or % change in lattice constant |
| Compression | −500 | 52.7 | 47.3 | −1961 | −0.138889 | 32.8433 | 5.683837 | 0.38% |
| Compression | −200 | 51.1 | 48.9 | −799 | −0.055556 | 32.9266 | 5.671064 | 0.15% |
| Lattice match | 0 | 50.0 | 50 | 0 | 0.000000 | 32.9822 | 5.662587 | 0.00% |
| Tension | 50 | 49.8 | 50.2 | 145 | 0.013889 | 32.9960 | 5.660473 | −0.04% |
| Tension | 100 | 49.5 | 50.5 | 363 | 0.027778 | 33.0099 | 5.658360 | −0.07% |
| Tension | 200 | 49.0 | 51 | 726 | 0.055556 | 33.0377 | 5.654141 | −0.15% |
| Tension | 300 | 48.4 | 51.6 | 1161 | 0.083333 | 33.0655 | 5.649929 | −0.22% |
| Tension | 400 | 47.9 | 52.1 | 1524 | 0.111111 | 33.0933 | 5.645725 | −0.30% |
| Tension | 500 | 47.4 | 52.6 | 1887 | 0.138889 | 33.1210 | 5.641528 | −0.37% |
| Tension | 600 | 46.9 | 53.1 | 2250 | 0.166667 | 33.1488 | 5.637339 | −0.45% |
| Tension | 700 | 46.4 | 53.6 | 2250 | 0.194444 | 33.1766 | 5.633158 | −0.52% |

Figure 8:
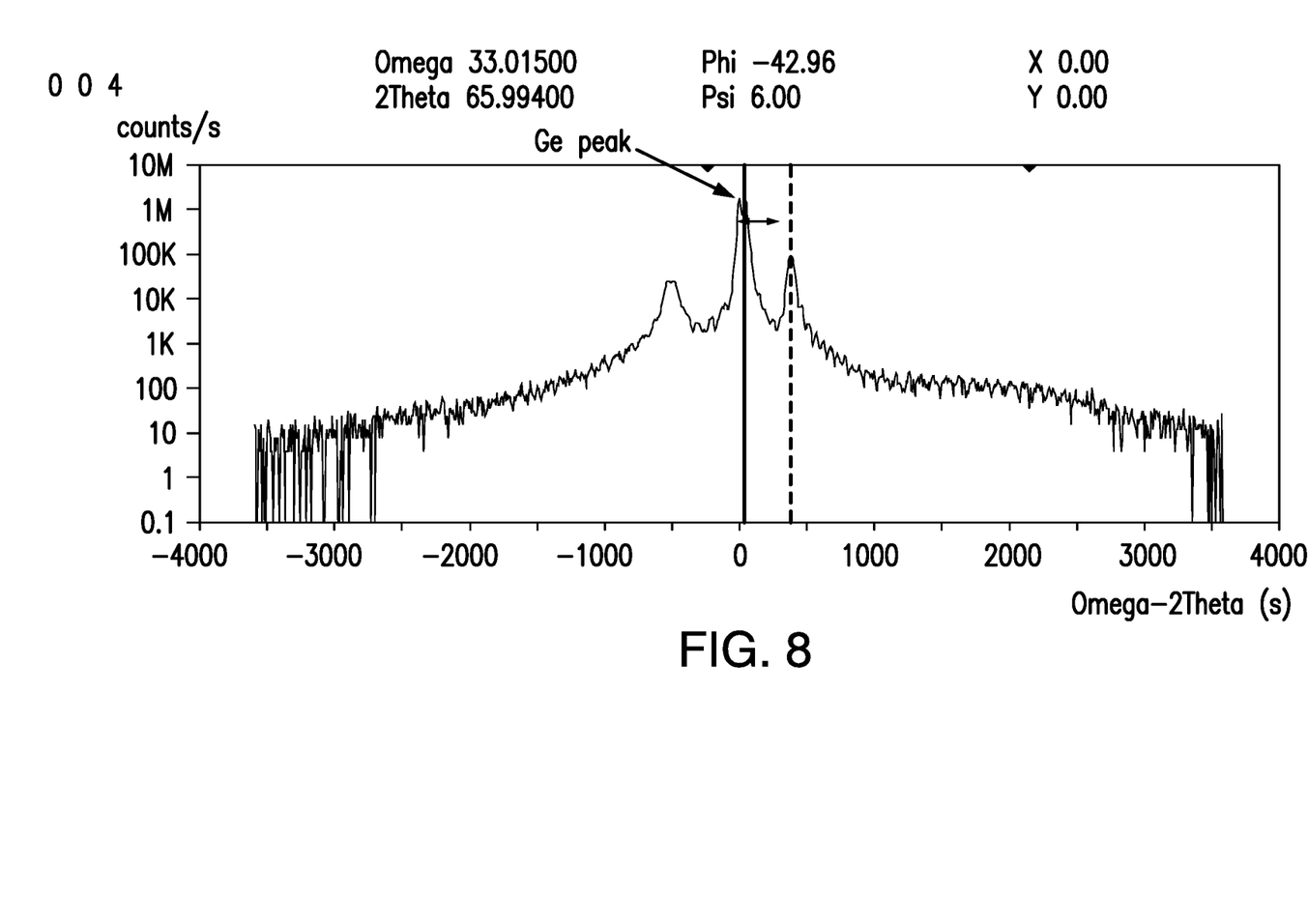
FIG. 8 is an illustration of a rocking curve used to measure strain in crystalline materials.

An exemplary rocking curve is illustrated in FIG. 8 for a bulk $Al_xIn_{1-x}P$ composition 0<y<1 showing a large Ge peak for the substrate. Increasing the amount of aluminum in the material to above the amount needed to lattice match to the Ge substrate results in a peak displaced to the right of the substrate peak. Conversely, decreasing the amount of aluminum in the material to below the amount needed to lattice match to the Ge substrate results in a peak displaced to the left of the substrate peak. In the rocking curve illustrated in FIG. 8, the peak has been displaced 340 arcseconds to the right of the substrate peak.

In another embodiment, the materials formulation of the window layer is depicted by the shaded region on both sides of the heavy straight line noted above. The window material has a graded composition such that the material at the interface between the top surface of the emitter layer of the at least one solar subcell and the bottom surface of the window layer has a compression as measured by a delta in the Bragg angle from the substrate in the range of plus or minus 200 arcseconds from a point approximately 200 arcseconds in compression, and material at the top surface of the window layer has a tension as measured by a delta in the Bragg angle from the substrate in the range of plus or minus 200 arcseconds from a point approximately 500 arcseconds in tension, wherein the delta in the Bragg angle is obtained from a rocking curve from a triple axis coupled scan of Ω and 2θ (omega-2theta) using 1.5406 Å x-ray radiation source.

In any of the embodiments noted above, the change in lattice constant over the thickness of the emitter layer may occur in a linear or non-linear manner, smoothly in a continuous manner, or in steps, or a combination thereof.

Figure 5:
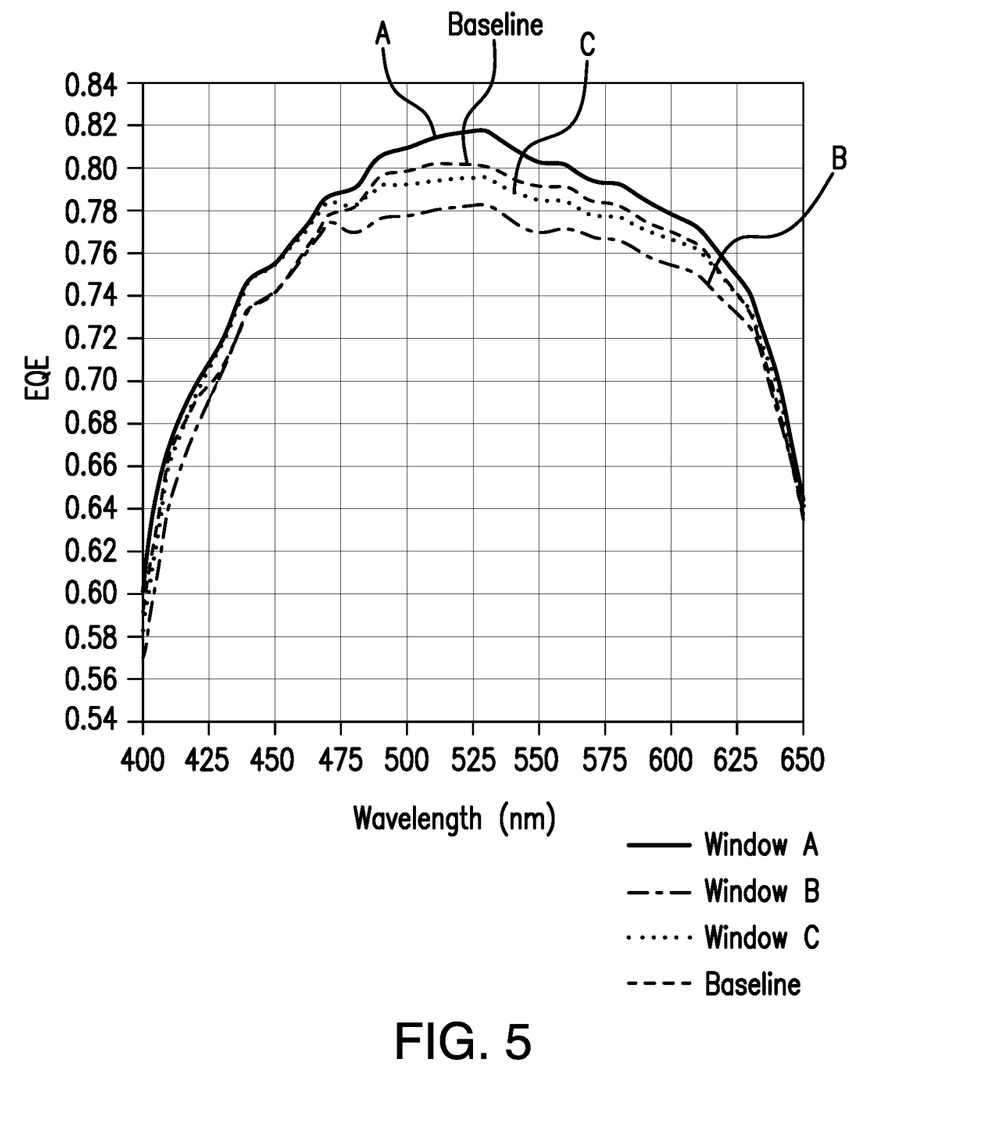
FIG. 5 is a graph representing the quantum efficiency (EQE) of specimen solar cells using four different formulations for the composition of the window layer.

FIG. 5 is a graph representing the quantum efficiency (EQE) of specimen solar cells using four different formulations for the composition of the window layer based on experimental data. The improvement over a baseline composition and compositions representing different gradations in lattice constant is apparent.

Figure 6:
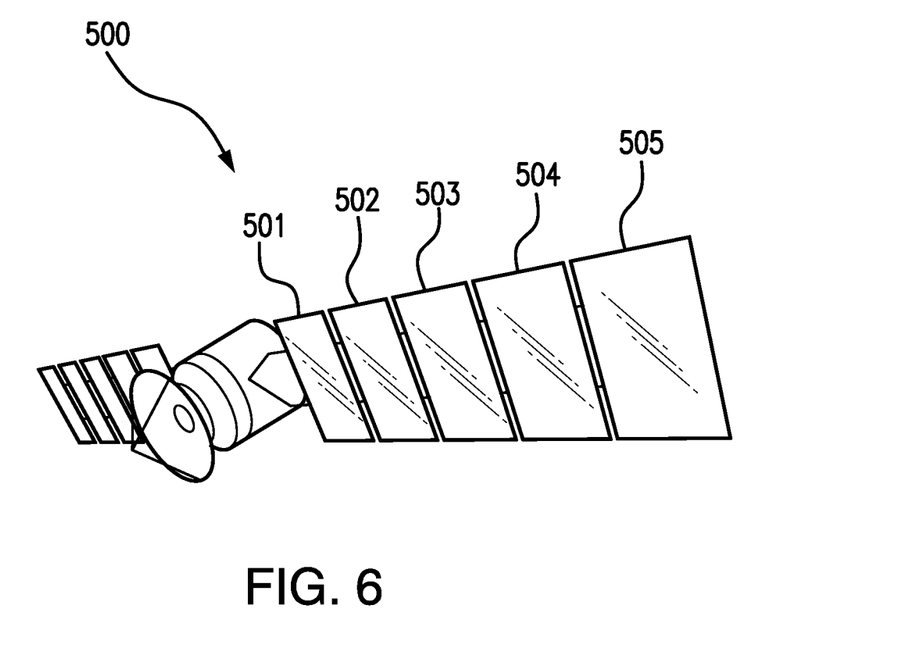
FIG. 6 is a first embodiment of a space vehicle incorporating a photoelectric power system according to the present disclosure.

FIG. 6 is a highly simplified perspective view of a first embodiment of a space vehicle incorporating a photoelectric power system according to the present disclosure. The space vehicle 500 includes a plurality of foldable substantially rectangular panels 501, 502, 503, 504, etc. which extend from the vehicle to form "wings".

Figure 7:
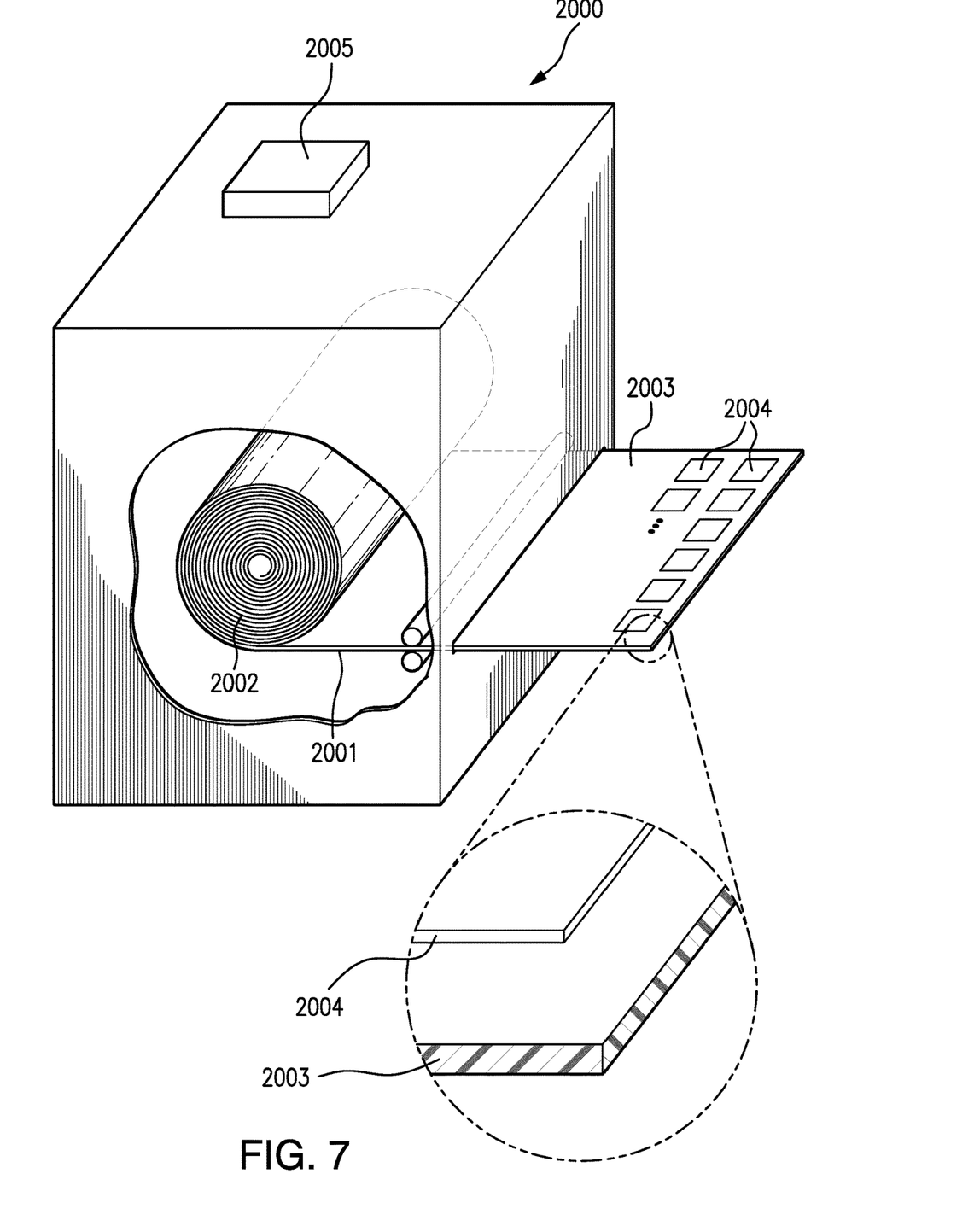
FIG. 7 is a second embodiment of a space vehicle incorporating a photoelectric power system with roll-out deployment according to the present disclosure.

FIG. 7 is a highly simplified perspective view of a second embodiment of a space vehicle incorporating a photoelectric power system with roll-out deployment according to the present disclosure. In this embodiment, the space vehicle 2000 incorporates a solar cell array 2004 mounted on a deployable flexible sheet 2003 in which the solar cell array 2004 incorporates the solar cells or solar cell modules according to the present disclosure. In some embodiments, the modules may include a solar cell assembly comprising an optical concentrating element for producing optical concentration at least 5×; and a multijunction solar cell disposed beneath the optical concentrating element so that concentrated light impinges on the top surface of the solar cell, as more specifically set forth in U.S. patent application Ser. No. 14/663,741, filed Mar. 20, 2015, herein incorporated by reference.

The sheet 2003 may wrap around a mandrel 2002 prior to being deployed in space. The space vehicle 2000 includes a payload 2005 which is powered by the array of solar cell assemblies 2004.

It will be understood that each of the elements described above, or two or more together, also may find a useful application in other types of structures or constructions differing from the types of structures or constructions described above.

Although described embodiments of the present disclosure utilizes a vertical stack of three subcells, various aspects and features of the present disclosure can apply to stacks with fewer or greater number of subcells, i.e. two junction cells, four junction cells, five, six, seven junction cells, etc. In the case of seven or more junction cells, the use of more than two metamorphic grading interlayer may also be utilized.

In addition, although the disclosed embodiments are configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the solar cell described in the present disclosure may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell 309, with p-type and n-type InGaP is one example of a homojunction subcell.

In some cells, a thin so-called "intrinsic layer" may be placed between the emitter layer and base layer, with the same or different composition from either the emitter or the base layer. The intrinsic layer may function to suppress minority-carrier recombination in the space-charge region. Similarly, either the base layer or the emitter layer may also be intrinsic or not-intentionally-doped ("NID") over part or all of its thickness.

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

While the solar cell described in the present disclosure has been illustrated and described as embodied in a conventional multijunction solar cell, it is not intended to be limited to the details shown, since it is also applicable to inverted metamorphic solar cells, and various modifications and structural changes may be made without departing in any way from the spirit of the present invention.

Thus, while the description of the semiconductor device described in the present disclosure has focused primarily on solar cells or photovoltaic devices, persons skilled in the art know that other optoelectronic devices, such as thermophotovoltaic (TPV) cells, photodetectors and light-emitting diodes (LEDS), are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, from the foregoing others can, by applying current knowledge, readily adapt the present invention for various applications. Such adaptations should and are intended to be comprehended within the meaning and range of equivalence of the following claims.

The invention claimed is:

1. A solar cell comprising:
at least one solar subcell having an emitter layer, a base layer, and a window layer adjacent to the emitter layer composed of a semiconductor window material, wherein the semiconductor window material has a graded composition such that the semiconductor window material at the bottom surface of the window layer has a compression characterized by a change in lattice constant relative to the emitter layer in the range of +0.25% to 0 or a tension characterized by a change in lattice constant relative to the emitter layer of 0 to −0.37%, and the semiconductor window material at the top surface of the window layer has a tension characterized by a change in lattice constant relative to the emitter layer in a range of −0.37% to −1.50%, wherein the window layer is composed of InAlP having an aluminum content that is greater at the top surface of the window layer than at the bottom surface of the window layer.

2. The solar cell as defined in claim 1, wherein the Al content at the bottom surface of the window layer is 48.5% or less and the Al content at the top surface of the window layer is at least 5% greater than the Al content at the bottom surface.

3. The solar cell as defined in claim 1, wherein the compression of the semiconductor window material at the bottom surface of the window layer is further characterized by a shift in the Bragg angle by x-ray diffractometry relative to the emitter layer, wherein the shift in the Bragg angle by x-ray diffractometry relative to the emitter layer is in a range of −100 to −300 arcseconds, and the tension of the semiconductor window material at the top surface of the window layer is further characterized by a shift in the Bragg angle relative to the emitter layer in a range of 500 to 600 arcseconds.

4. The solar cell as defined in claim 1, wherein the compression of the semiconductor window material of at least one solar subcell at the bottom surface of the window layer is further characterized by a shift in the Bragg angle by x-ray diffractometry relative to the emitter layer of approximately −200 arcseconds, and the tension in the semiconductor window material at the top surface of the window layer is further characterized by a shift in the Bragg angle relative to the emitter layer of approximately 500 arcseconds.

5. The solar cell as defined in claim 2, wherein the Al content of the window layer is linearly graded so that the content of Al in the window layer linearly increases from the bottom surface of the window layer to the top surface of the window layer.

6. The solar cell as defined in claim 1, wherein the solar cell is a multijunction solar cell, and wherein the at least one solar subcell with the composition of the window layer being graded is an upper first solar subcell.

7. The solar cell as defined in claim 6, wherein the base layer of the upper first solar subcell is composed of InGaP and the emitter layer of the upper first solar subcell is composed of InGaP, and the base layer of the upper first solar subcell has a band gap that is equal to or greater than 1.87 eV.

8. The solar cell as defined in claim 6, wherein the emitter layer of the upper first solar subcell has a thickness of 80 nm, and the window layer has a thickness of less than 220 Angstroms.

9. The solar cell as defined in claim 6 further comprising a second solar subcell and a lower solar subcell;
wherein the upper first subcell is composed of indium gallium phosphide;
wherein the second solar subcell is disposed adjacent to and lattice matched to said upper first solar subcell, the second solar subcell including an emitter layer composed of indium gallium phosphide, and a base layer composed of indium gallium arsenide that is lattice matched to the emitter layer; and wherein the lower solar subcell is lattice matched to said second solar subcell and is composed of germanium.

10. The solar cell as defined in claim 1, wherein the base of the at least one solar subcell with a graded window layer is composed of InGaP and the emitter of the at least one solar subcell with a graded window layer is composed of InGaP.

11. The solar cell as defined in claim 1, wherein the at least one solar subcell with the composition of the window layer being graded is a middle solar subcell.

12. The solar cell as defined in claim 1, wherein the sequence of subcells include an upper first solar subcell composed of indium gallium phosphide;
   a second solar subcell disposed adjacent to and lattice matched to said upper first solar subcell, the second solar subcell including an emitter layer composed of indium gallium phosphide, and a base layer composed of indium gallium arsenide that is lattice matched to the emitter layer;
   and a lower solar subcell that is lattice matched to said second solar subcell and is composed of germanium.

13. The solar cell of claim 1 wherein the Al content at the bottom surface of the window layer is 48.5% or less, wherein the Al content of the window layer is linearly graded so that the concentration of Al in the window layer linearly increases from the bottom surface of the window layer to the top surface of the window layer, wherein the semiconductor window material at the bottom surface of the window layer is further characterized by a shift in the Bragg angle by x-ray diffractometry from the emitter layer in a range of −100 to −300 arcseconds, and the tension of the semiconductor window material at the top surface of the window layer is further characterized by a shift in the Bragg angle from the emitter layer is in a range of 500 to 600 arcseconds, wherein the solar cell is a multijunction solar cell, wherein the at least one solar subcell with the composition of the window layer being graded is the upper first solar subcell, wherein the base layer of the upper first solar subcell is composed of InGaP and the emitter layer of the upper first solar subcell is composed of InGaP, and the base layer of the upper first solar subcell has a band gap that is equal to or greater than 1.87 eV, and wherein the emitter layer of the upper first solar subcell has a thickness of 80 nm, and the window layer has a thickness of less than 220 Angstroms.

14. A solar cell assembly comprising:
   an optical concentrating element for producing optical concentration at least 5 times;
   a multijunction solar cell disposed beneath the optical concentrating element so that concentrated light impinges on the top surface of the solar cell;
   wherein the solar cell includes a substrate and at least one solar subcell having an emitter layer, a base layer, and a window layer adjacent to the emitter layer, the window layer being composed of a semiconductor window material, wherein the semiconductor window material has a graded composition such that the semiconductor window material at the bottom surface of the window layer has a compression as measured by a shift in the Bragg angle by x-ray diffractometry relative to the emitter in a range of 0 to −500 arcseconds, and semiconductor window material at the top surface of the window layer has a tension as measured by a shift in the Bragg angle relative to the emitter in a range of 50 to 700 arcseconds, wherein the window layer is composed of InAlP having an aluminum content that is greater at the top surface of the window layer than at the bottom surface of the window layer.

15. The solar cell assembly as defined in claim 14, wherein the window layer is composed of InAlP or InGaP and the Al content at the bottom surface of the window layer is 48.5% or less.

16. The solar cell assembly as defined in claim 14, wherein the Al content of the window layer is linearly graded so that the content of Al in the window layer linearly increases from the bottom surface of the window layer to the top surface of the window layer.

17. The solar cell assembly as defined in claim 14, wherein the at least one solar subcell with the composition of the window layer being graded is an upper first solar cell.

18. The solar cell assembly as defined in claim 14, wherein the base layer of the at least one solar subcell with the composition of the window layer being graded is composed of InGaP and the emitter of the at least one solar subcell with the composition of the window layer being graded is composed of InGaP.

19. The solar cell assembly as defined in claim 14, wherein the at least one solar subcell with the composition of the window layer being graded is a middle solar subcell.

20. The solar cell assembly as defined in claim 17, further comprising a second solar subcell and a lower solar subcell;
   wherein the upper first subcell is composed of indium gallium phosphide;
   wherein the second solar subcell is disposed adjacent to and lattice matched to said upper first solar subcell, the second solar subcell including an emitter layer composed of indium gallium phosphide, and a base layer composed of indium gallium arsenide that is lattice matched to the emitter layer; and
   wherein the lower solar subcell is lattice matched to said second solar subcell and is composed of germanium.

* * * * *